United States Patent [19]

Powers et al.

[11] Patent Number: 5,347,341
[45] Date of Patent: Sep. 13, 1994

[54] PHOTOGRAPHIC PRINTING APPARATUS

[75] Inventors: John W. Powers, Springfield; Daniel G. Choate, Everton, both of Mo.

[73] Assignee: Western Litho Plate & Supply Co., St. Louis, Mo.

[21] Appl. No.: 75,218

[22] Filed: Jun. 10, 1993

[51] Int. Cl.$^5$ .............................................. G03B 27/04
[52] U.S. Cl. ........................................ 355/91; 355/85; 355/99; 355/102
[58] Field of Search ...................... 355/85, 91, 99, 102

[56] References Cited

U.S. PATENT DOCUMENTS

| | | | |
|---|---|---|---|
| 3,635,559 | 1/1972 | Harrell et al. | 27/4 |
| 3,810,694 | 5/1974 | Harrell et al. | 27/42 |
| 4,178,097 | 12/1979 | Sara | 27/30 |
| 4,353,647 | 10/1979 | Powers | 27/4 |
| 4,423,955 | 1/1984 | Powers | 27/4 |
| 4,575,235 | 3/1986 | Copeland et al. | 47/96 |
| 4,951,089 | 8/1990 | Powers | 27/4 |

Primary Examiner—Michael L. Gellner
Assistant Examiner—Daniel P. Malley
Attorney, Agent, or Firm—Senniger, Powers, Leavitt & Roedel

[57] ABSTRACT

Apparatus for exposing photosensitized plates to light through films, having a window movable up and down at an exposure station adapted to grip a film after an exposure of a plate and to lift the film away from the plate, plates and films being fed in under its raised window from a loading station, films being discharged from the bottom of the raised window to a tray located above the loading system in a position wherein it does not interfere with manual loading of plates and films in the apparatus.

4 Claims, 9 Drawing Sheets

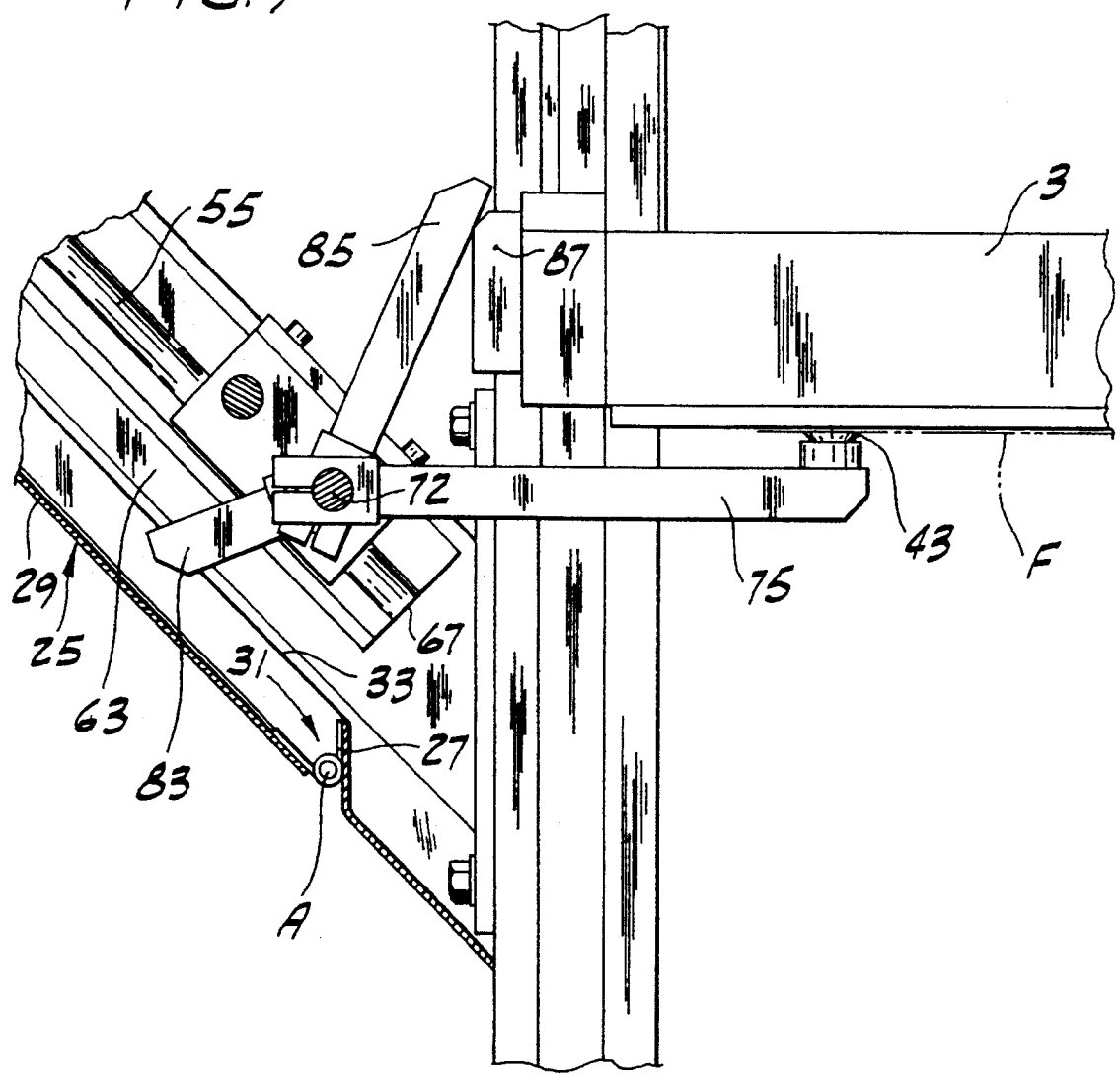

PHOTOGRAPHIC PRINTING APPARATUS

BRIEF SUMMARY OF THE INVENTION

This invention relates to photographic printing apparatus, and more particularly to apparatus in which photosensitive plates, especially lithographic plates, are exposed to light through films.

The invention is in the same field as the apparatus disclosed the following U.S. Patents:

| Number | Issue Date | Title |
| --- | --- | --- |
| 3,635,559 | January 18, 1972 | Photographic Printing Apparatus |
| 3,810,694 | May 14, 1974 | Photographic Printing Apparatus |
| 4,353,647 | October 12, 1982 | Photographic Printing Apparatus |
| 4,423,955 | January 3, 1984 | Photographic Printing Apparatus |
| 4,575,235 | March 11, 1986 | Photographic Printing Apparatus and Methods |
| 4,951,089 | August 21, 1990 | Photographic Printing Apparatus |

All of the above and particularly U.S. Pat. Nos. 4,423,955 and 4,575,235 are incorporated herein by reference.

U.S. Pat. No. 4,423,955 discloses apparatus in which lithographic plates are exposed to light through films at an exposure station, the apparatus having an exposure window at the exposure station movable up and down between a raised retracted position and a lowered position. The window occupies the raised retracted position for delivery to the exposure station of a plate or plates and a film or films from supply stacks thereof and for discharge of exposed plates and films from the exposure station after exposure operations. In the lowered position, the window presses down on the film or films and the plate or plates at the exposure station. The window has vacuum means for gripping a film to the bottom thereof when the window is raised after exposure of a plate or plates through the film or films to retain the film or films thereon for exposure of one or more additional plates to light through the retained film or films. Means is provided for discharging an exposed plate or plates and discharging a film or films from the raised window when the additional plate or plates have been exposed to light. Plates and films are automatically fed into the exposure station in what may be referred to as forward direction from the supply stacks held in position for infeed of plates and films to the exposure station. Plates and films are discharged in forward direction and the films are fed back underneath the exposure station to a tray underneath the supply stack location.

U.S. Pat. No. 4,575,235 discloses apparatus similar to that of U.S. Pat. No. 4,423,955 except that it is semi-automatic in respect to loading the plates and films, having first and second platens each movable from a loading position at a loading station rearward of the exposure station to an exposure position in the exposure station, each platen being manually loaded with a plate (or plates) and a film on the plate (or a film on each plate), when the platen is in its retracted position, by an operator stationed at the loading station. The loaded platen is moved from the loading station into the exposure station and the other platen, which was in the exposure station, shuttles back out to the loading station.

Among the several objects of this invention may be noted the provision of photographic printing apparatus of the class described, and particularly semi-automatic apparatus wherein plates and films are manually applied to platens at a loading station as in U.S. Pat. No. 4,575,235 by an operator standing adjacent the loading station at the rearward end of the apparatus, with a film discharge system which effects discharge of each film from the bottom of the raised window and stacking of discharged films in a position convenient for handling by an operator at the rearward end of the apparatus, with the discharged films neatly stacked in order, as distinguished from discharge of the film with return of the film below the exposure station to a receiver or tray below the loading station (as in U.S. Pat. No. 4,423,955); the provision in such apparatus of a system for rearward discharge of films back over the loading station which does not impede the operator in the loading of plates and films at the loading station; and the provision of such apparatus with such a discharge system of simplified construction as regards the discharge system of U.S. Pat. No. 4,423,955.

In general, photographic apparatus of this invention for exposing photosensitized plates to light through films comprises an exposure station in which a plate is exposed to light through a film and a window movable downwardly from a raised retracted position above a plate and film thereon in exposure position at the exposure station to a lowered position pressing down on the film and plate in exposure position. Plates and films are fed forward into the exposure station a loading station adjacent the exposure station, the window being raised for the infeed. A platen is movable from a position at the loading station for the manual loading thereon of a plate and a film on the plate or a plate per see to exposure position in the exposure station. The plate is exposed to light through the film from a light source when the window is down. Associated with the window is means operable after exposure of a plate to light through film at the exposure station to grip the film to the bottom of the window for raising the film with the window when the window is raised. The apparatus further comprises means operable when the window is raised for discharging the exposed plate from the exposure station, and means operable when the window is raised for discharging the raised film from the exposure station, and is characterized in that it is provided with means above the loading station for receiving films discharged from the exposure station, and in that the means for discharging a raised film from the exposure station comprises means for transferring a film from its raised position on the bottom of the raised window to the film-receiving means. The film-receiving means comprises a tray having an inclined film-receiving position in an inclined plane angled downwardly and forwardly toward the exposure station, the tray being pivoted at one end constituting its forward end toward the exposure station for swinging movement about a generally horizontal axis transverse to the apparatus between its inclined film-receiving position and a generally horizontal film-retrieving position above the loading station. The film discharge means comprises a carriage extending transversely with respect to the apparatus above the loading station, means mounting the carriage for movement in an inclined plane above and generally parallel to the said inclined plane of the tray toward and away from the exposure station, a set of vacuum grippers carried by the carriage for movement up and down relative to the carriage between a raised position for gripping a film on the bottom of the raised window at the bottom face of the film and a lowered position for withdrawing the gripped film rearward from the exposure station and carrying it back over the tray, means for moving the carriage in its said inclined plane of movement between a rearward raised retracted position away from the exposure station and a forward lowered advanced position wherein the grippers are under the raised window, and means for raising and lowering the grippers.

Other objects and features will be in part apparent and in part pointed out hereinafter.

BRIEF DESCRIPTION OF THE DRAWINGS

FIG. 9 is a view in section of the carriage at the lower and forward end of its stroke.

Corresponding reference characters indicate corresponding parts throughout the drawings.

DETAILED DESCRIPTION

Figure 1:
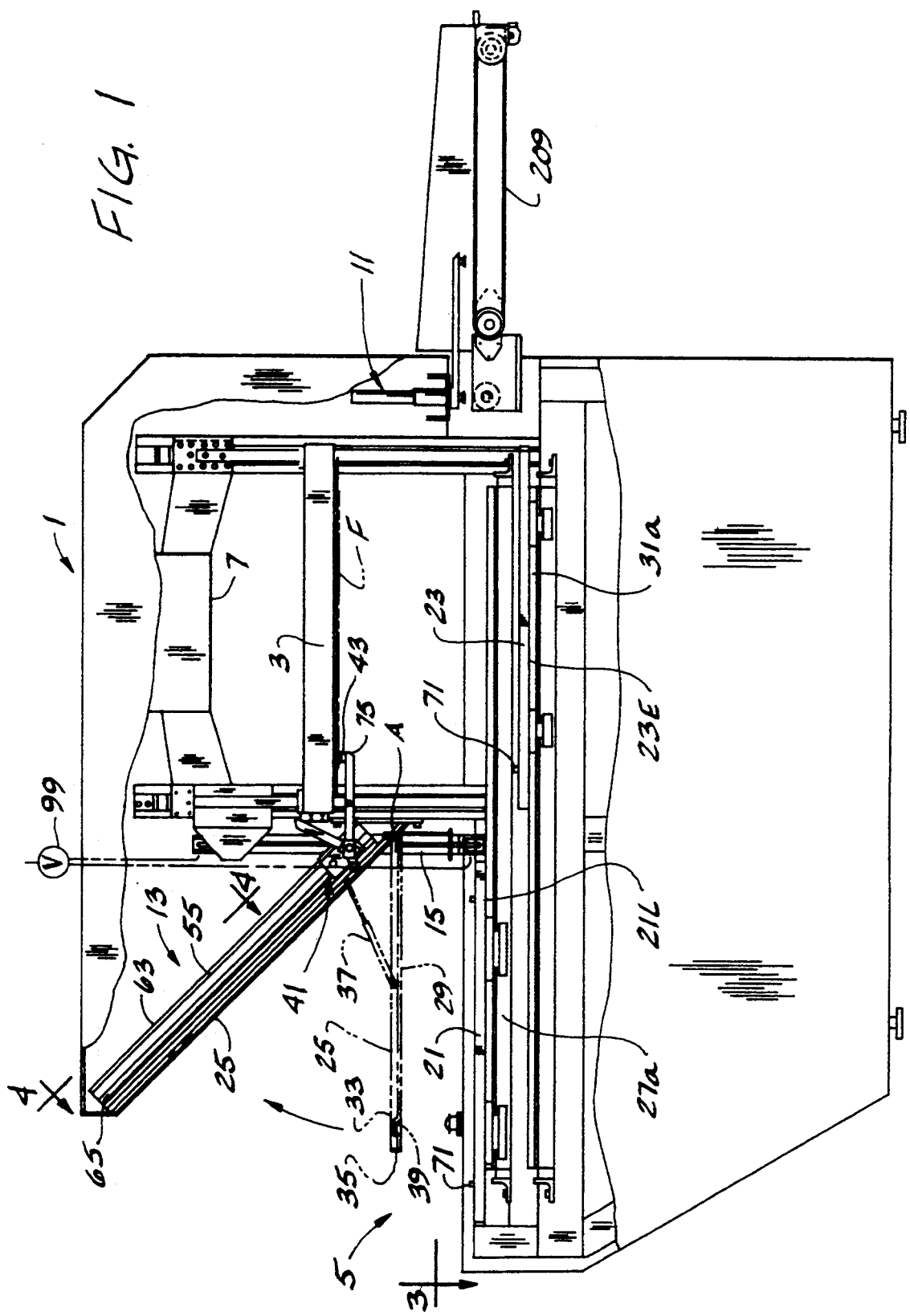
FIG. 1 is a semi-diagrammatic view in side elevation of a photographic printing apparatus having the present invention incorporated therein.
Figure 2:
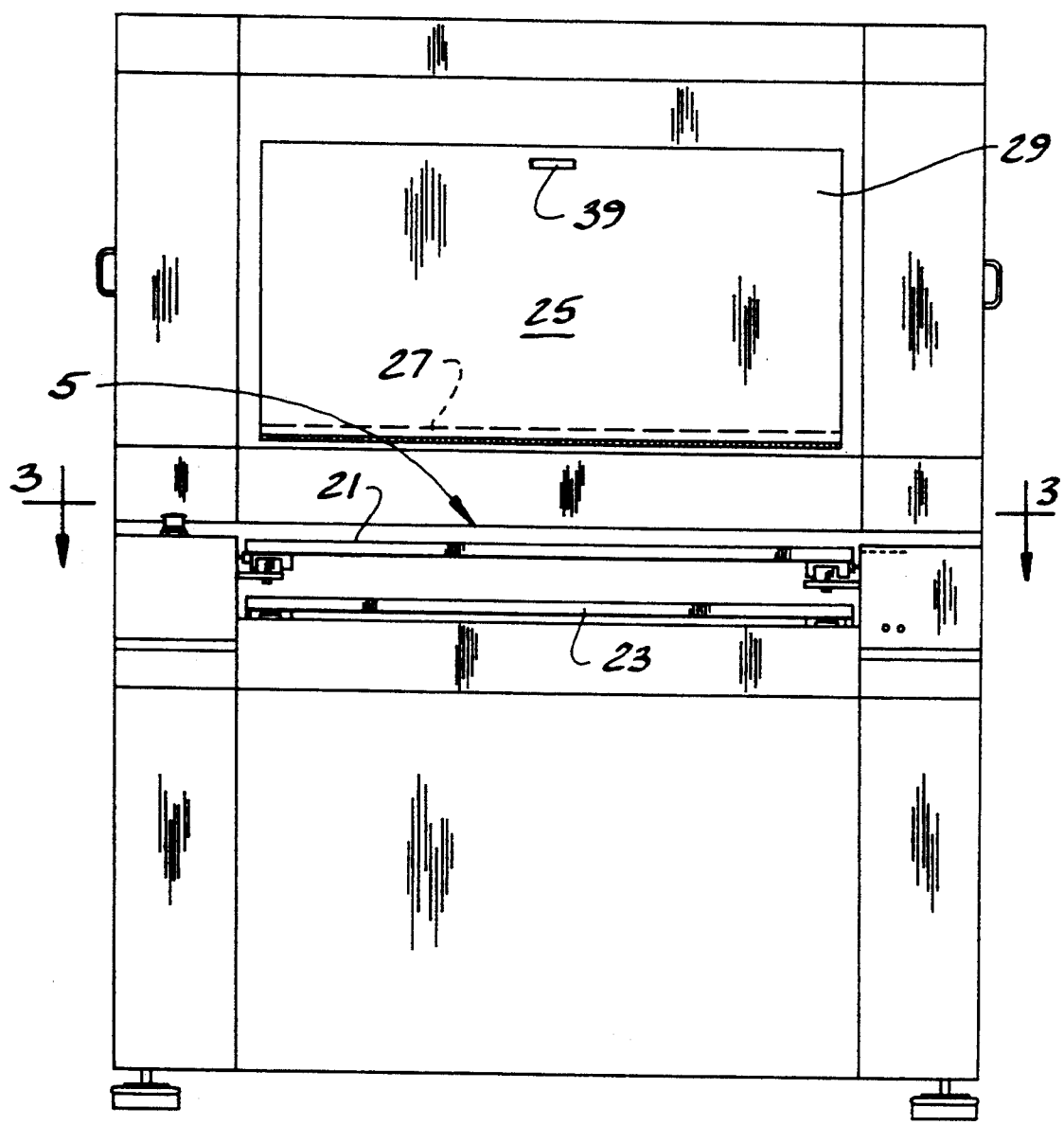
FIG. 2 is an end elevation of the apparatus as viewed from the left in FIG. 1.

Referring to the drawings, apparatus of this invention is shown generally to comprise an exposure station 1 in which a plate P, e.g. a lithographic plate, is exposed to light through a film F. While the invention is herein described as operable to expose one plate, e.g. a double-page newspaper printing plate, at a time to light through a film, it will be understood that two plates, e.g. two single-page newspaper printing plates positioned side-by-side may be exposed at one time to light through films thereon, as shown in U.S. Pat. No. 4,423,955. At the exposure station is an exposure window 3 movable downwardly from a raised retracted position above a plate and a film thereon in exposure position at the exposure station to a lowered position pressing down on the film and plate in exposure position. Plates and films are fed into the exposure station from a loading station indicated at 5 adjacent the exposure station, the window 3 being raised for the infeed. The direction of feed is referred to as forward, and the loading station is referred to as being adjacent the rearward end of the exposure station and at the rearward end (the infeed end) of the apparatus. At 7 is indicated a light source for exposing each plate to light through the film thereon when the window is down. At 9 (FIG. 7) is generally indicted means, more particularly vacuum means, associated with the window operable after exposure of each plate to light through the respective film at the exposure station to grip each film to the bottom of the window for raising each film with the window when the window is raised and retaining the films on the bottom of the window. At 11 is generally indicated means operable when the window is raised for discharging each exposed plate from the exposure station, and at 13 is generally indicated means also operable when the window is raised for discharging each raised film from the exposure station.

Figure 7:
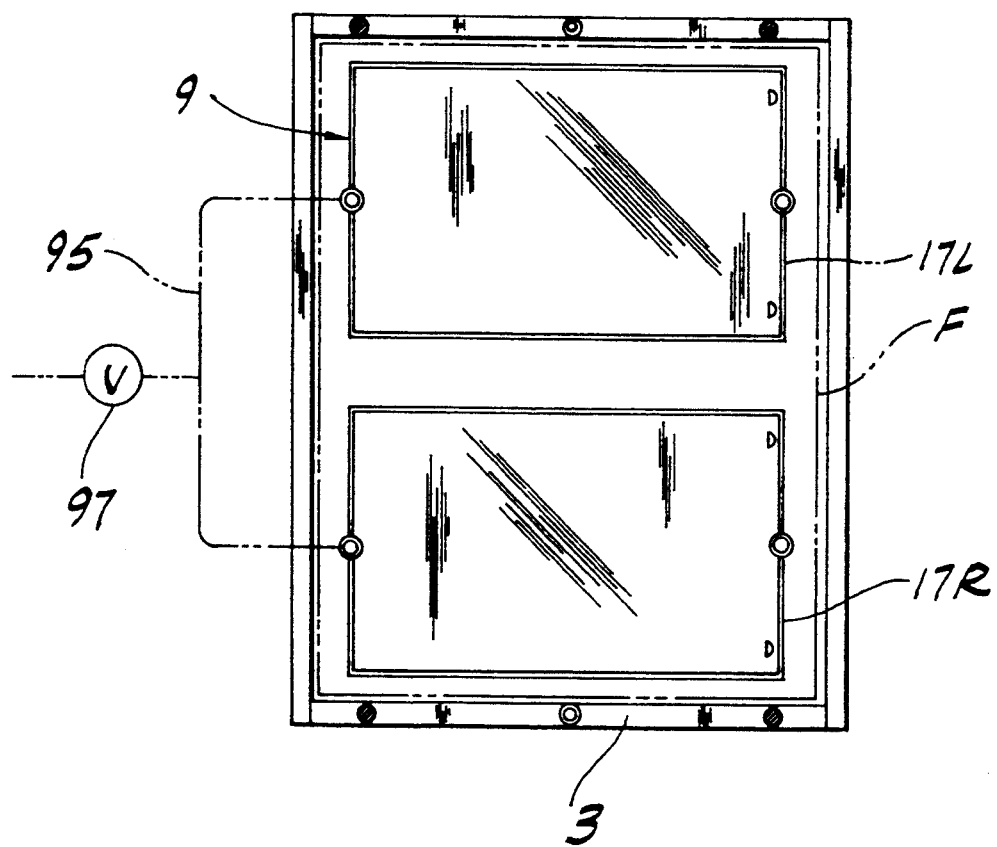
FIG. 7 is a view of the bottom of the window of the apparatus showing the vacuum groves in the bottom of the window for vacuum gripping a film to the bottom of the window.

The exposure window 3 is movable up and down by air cylinder means as indicated at 15 for engagement of its lower face with a film F on a plate P to be exposed. As shown in FIG. 7 the window has left and right-hand sets of vacuum groves 17L and 17R such as disclosed in said U.S. Pat. No. 4,575,235 and U.S. Pat. No. 4,423,935 in the bottom face for vacuum gripping a film to its lower face for raising the film along with the window away from the plate. It will be understood that two single-page films F positioned side-by-side may be gripped to the bottom of the window.

Figure 3:
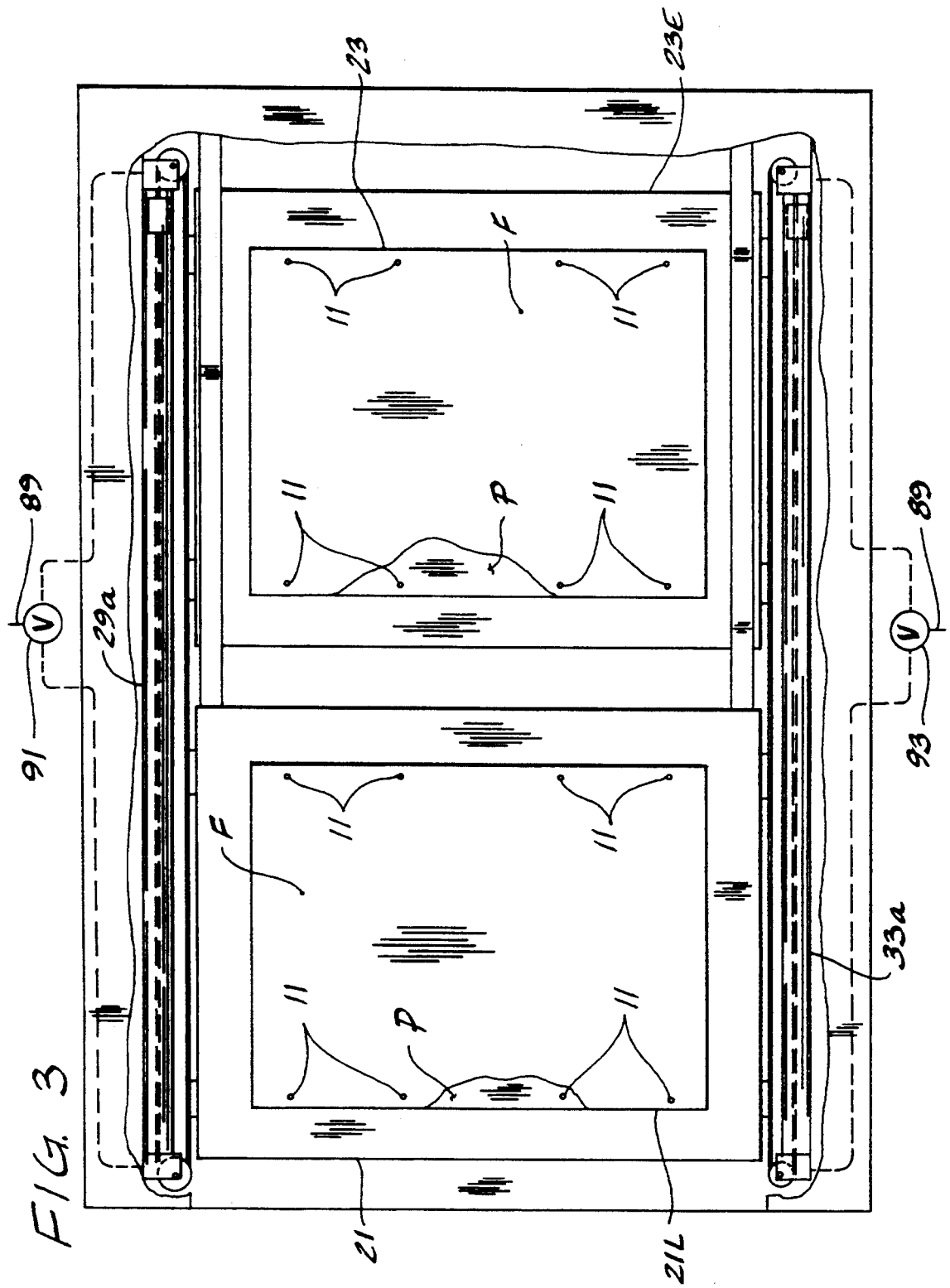
FIG. 3 is a view generally on line 3—3 of FIGS. 1 and 2 showing certain plate and film carrying platens of the apparatus, one in loading position at the loading station of the apparatus and the other at the exposure station of the apparatus.

For bringing plates P with films F thereon into the exposure station, the apparatus has a double-platen system corresponding to that disclosed in U.S. Pat. No. 4,575,235 comprising a first platen 21 and a second platen 23, one being operable to bring a plate with a film thereon (or two plates each with a film thereon side-by-side) into the exposure station and hold it there for an exposure operation while the other is being loaded with a plate or film (or plates and films). As shown in FIGS. 1 and 3 each of these platens has registration pins 71 for registration of plates and films thereon, and may have vacuum grooves and a sealing strip like the platen 11 shown in said U.S. Pat. No. 4,423,455. However, where said platen 11 shown in said U.S. Pat. No. 4,423,455 is fixed in position at the exposure station, platens 21 and 23 move into and back out of the exposure station. Thus, each of the platens 21 and 23 is movable from a loading position at loading station 5 outside the exposure station to an exposure position at the exposure station for exposure of a plate P on the platen to light through the window 3 and a film F, and movable back to loading position for reloading after the plate has been exposed. The loading position and exposure position for platen 21 is designated at 21L and the exposure position for platen 23 is indicated at 23E in FIG. 3. The platen 21 is horizontally slidable between its loading and exposure positions on rails 27a by means of a cable cylinder 29a. The platen 23 is horizontally slidable between its loading and exposure positions 23L and 23E in a horizontal plane below that of platen 21 on rails 31a by means of a cable cylinder 33a. Thus, the loading positions of platen 23 is directly below the loading position 21L of platen 21, and the exposure position of platen 23 is directly below the exposure position of platen 21.

The plate discharge means 11 picks up an exposed plate off the platen 21 or 23, as the case may be, and delivers it to a conveyor 209 for feeding it to a plate processor. This discharge means may correspond generally to the discharge means 19 shown in the aforesaid U.S. Pat. No. 4,423,955, except that its film grippers are omitted, and the conveyor 209 corresponds to the conveyor 209 shown in said patent.

FIGS. 1 and 3 show the lower platen 23, in its exposure position 23E at the exposure station, directly below the raised window 3, and show the upper platen 21 back in its loading position 21L at the loading station 5. On the platen 23 is a plate P and on the plate P is a film F, both having been previously loaded on the platen 23 at the loading station, and brought into the exposure station by moving the platen 23 with the plate and film thereon into the exposure station along the generally horizontal path of platen 23. The window 3 is lowered, engages the film, and presses the film down on the plate P on the platen 23 for exposure of the plate to light from light source 7 through the window and the film. As will be readily understood, the light source is energized to expose the plate to light through the window and film for an appropriate interval. The window is raised following the exposure of the plate, and, assuming a plurality of plates are to be exposed through the same film, the film is gripped to the lower face of the window and raised therewith away from the exposed plate. The discharge means 11 is brought in over the exposed plate (as in the aforesaid U.S. Pat. No. 4,423,955), and operated to pick up the plate and transfer it to the above-noted conveyor 209 for delivery to the plate processor.

While the plate P on platen 23 is being exposed at the exposure station, a plate P is loaded on the platen 21 at the loading station 5 and a film F is applied to the plate (if the plate is to be exposed through that film). The platen 23 is moved out of the exposure station back to its loading position at the loading station and the platen 21 with the next plate P to be exposed with the film F thereon is moved from the loading station into the exposure station bringing said next plate and the film thereon to exposure position under the window 3. The latter is lowered, pressing the film down on the plate P on the platen 21. The plate is exposed to light through the window and film, the window is raised, the exposed plate is removed by the discharge means 11, and the steps are repeated for successively exposing plates one after another at the exposure station. The film is retained on the window when the window is raised as many times as needed for exposing a desired number of plates to light through that film. When that number of plates has been exposed, the film discharge means 13 is activated to discharge the film from the bottom of the window out of the exposure station as subsequently described.

In accordance with this invention, means indicated generally at 25, and more particularly a tray, is provided above the loading station 1 (above the platen loading position) for receiving films discharged from the exposure station. This tray 25 is pivotable for swinging movement above a horizontal axis A extending transversely with respect to the apparatus at the forward end of the tray adjacent the rearward end of the exposure station at a level above the level of the platen 21 and below the level of the raised position of the window. The tray is swingable between the raised film-receiving position in which it is shown in solid lines in FIG. 1 inclined upward and rearward from the rearward end of the exposure station and the generally horizontal lowered film-retrieving position shown in phantom in FIG. 1. When the last of the additional plates has been exposed and the window raised, the film discharge means 13 is actuated to discharge the raised film rearwardly from the exposure station and place it in the tray, functioning to transfer a film from its raised position on the bottom of the raised window to the tray 25. Thus, the film discharge is in rearward direction, each film being gripped, released from the window, pulled back over the tray 25 and the grip released to deposit the film in the tray. At 27 is indicated a fixed vertical forward end wall for the tray, which wall may be constituted by an elongate hinge leaf extending transversely of the apparatus in a vertical plane adjacent the rearward end of the exposure station. The tray comprises a bottom wall 29 hinged as indicated at 31 (axis A) at the bottom of the forward end wall 27, side walls 33 and a rear end wall 35. It is swingable on the hinge axis at A (this axis extending horizontally transversely of the apparatus above the loading station 5 and below the level of the raised window adjacent the rearward end of the exposure station) between the raised film-receiving position in which it is shown in solid lines in FIG. 1 wherein it is inclined downwardly in forward direction from its outer rearward end at 35 to its forward end at the forward end wall 27 and the lowered horizontal position in which it is shown in phantom in FIG. 1. At 37 is indicated means for holding the tray raised and also determining its lowered horizontal position comprising a dashpot cylinder means interconnected between the tray and the frame of the apparatus. The tray has a recessed handle 39 at the bottom adjacent its rearward end.

For receiving films discharged rearward from its exposure station, the tray 25 is held in the raised inclined film-receiving position in which it is shown in solid lines in FIG. 1 angled downwardly and forwardly toward the exposure station. The film discharge means 13 comprises a carriage generally designated 41 extending transversely with respect to the apparatus above the loading station 5 (and above the tray 25). The carriage 41 is mounted for movement toward and away from the exposure station 1 in an inclined plane above and generally parallel to the inclined plane of the raised tray. It carries a plurality of vacuum grippers each designated 43, these grippers being mounted for movement up and down relative to the carriage between the raised position in which they are illustrated in solid lines in FIG. 1 for gripping a film on the bottom of the raised window by engagement with the bottom face of the film and a lowered position such as that in which they are illustrated in FIG. 8 for withdrawing the gripped film rearward from the exposure station and carrying it back over the raised tray 25.

Figure 4:
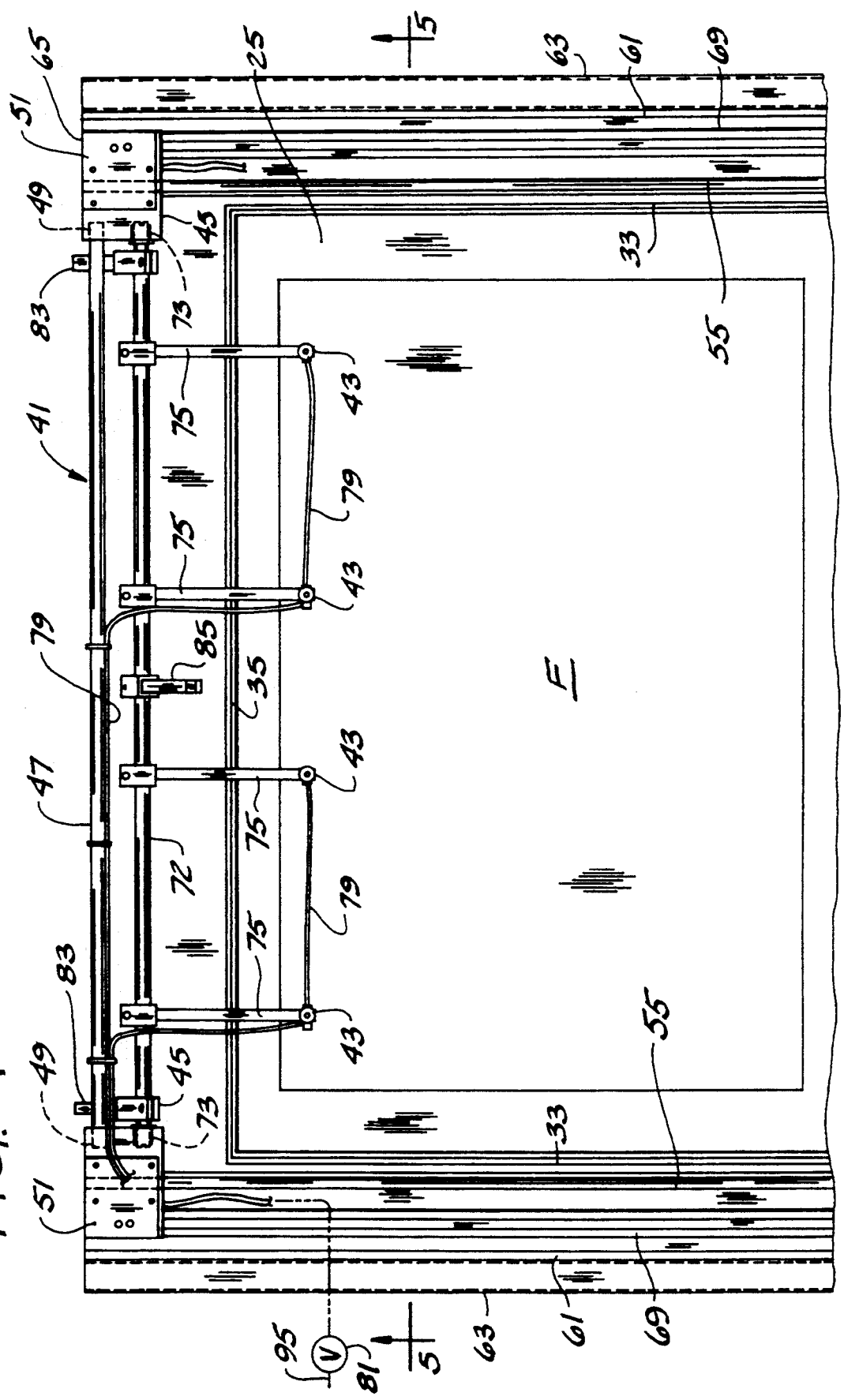
FIG. 4 is a view generally on line 4—4 of FIG. 1 showing a film discharge carriage in what constitutes its fully retracted position at the rearward and upper end of its stroke.
Figure 5:
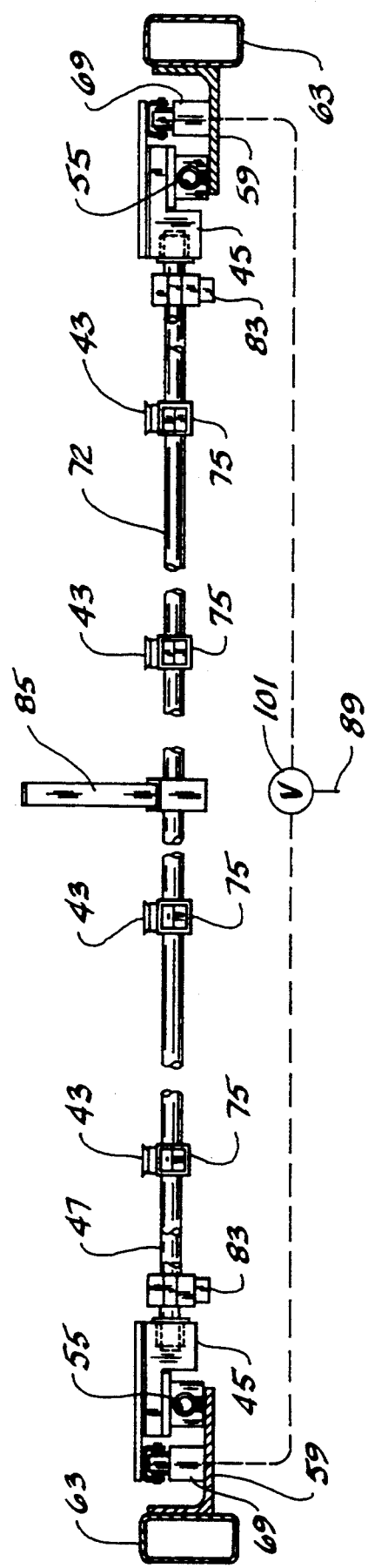
FIG. 5 is an enlarged transverse section on line 5—5 of FIG. 4.
Figure 6:
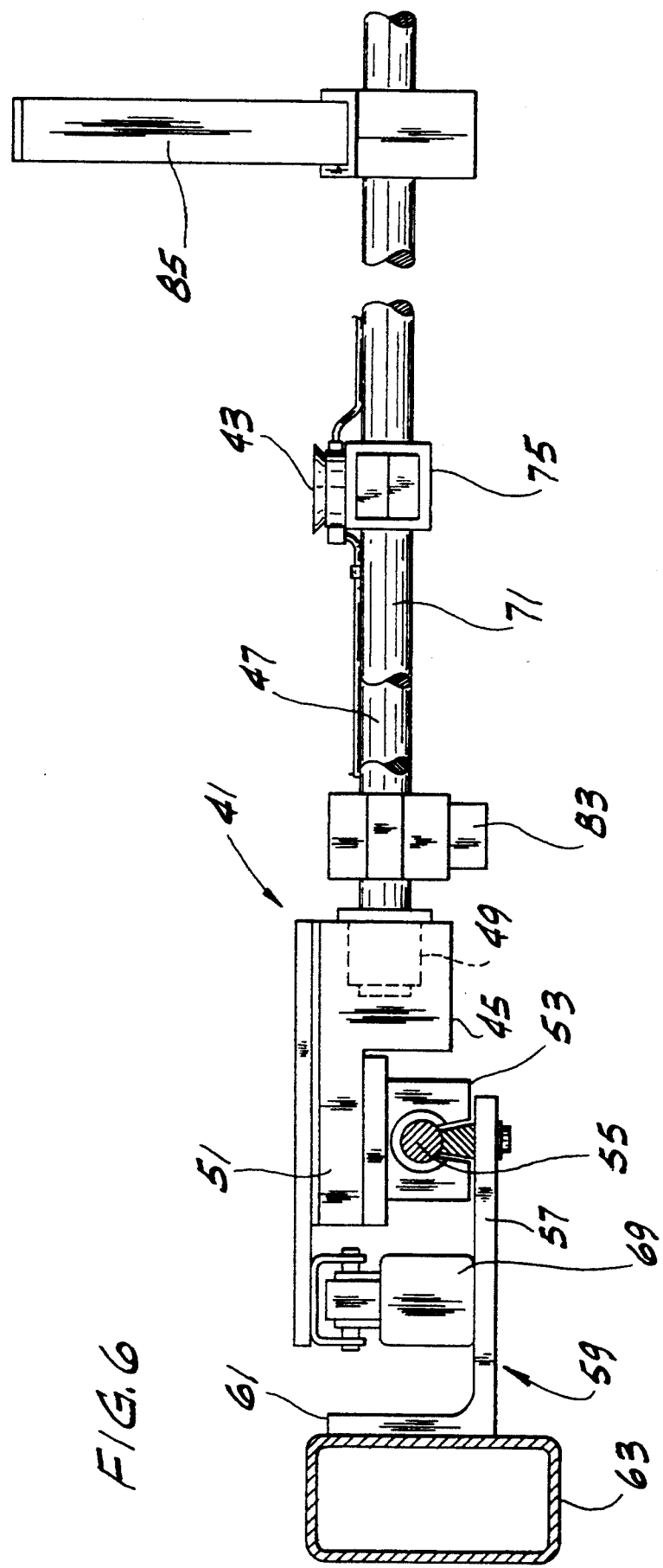
FIG. 6 is an enlarged fragment of FIG. 5.

The carriage 41 comprises a pair of slides, one at each side of the apparatus above the loading station, each designated 45, and a cross-bar 47 extending transversely of the apparatus between the slides, the ends of the bar being secured in holes 49 therefor in the slides. The slides have lateral extensions 51 carrying bushings 53 which are slidable on inclined rails 55 at opposite sides of the apparatus. The rails are mounted on legs 57 of angle-section members 59 which have their other legs 61 secured on the inside of inclined members 63 of the frame of the apparatus at opposite sides of the apparatus. These frame members 63 and the rails 55 are located above the loading station 5 in vertical longitudinal planes adjacent the sides of the apparatus being inclined downwardly and forwardly from their rear ends 65 to their lower forward ends 67, the latter being located adjacent the rearward end of the exposure station 1 at a level above the level of the loading station and below the horizontal plane of the raised window 3. The tray 25, in its raised inclined film-receiving position, lies below the inclined plane of the path of travel of the carriage 41, and closely adjacent this inclined plane. The carriage is movable back and forth on the rails 55 between the raised rearward retracted position away from the exposure station at the upper end of the rails (FIGS. 4 and 8) and the forward lowered position (FIG. 9) adjacent the rearward side of the exposure station at the lower end of the rails by means of a pair of elongate pneumatic rodless cylinders each designated 69 mounted on the legs 57 of the angle-section members 59. Each of the cylinders may be a pneumatic rodless cylinder such as manufactured by Origa Corporation of Elmhurst, Ill., described in the Origa brochure on its pneumatic rodless cylinder product line Copyright 1992.

The carriage 41 carries a rockshaft 72 extending between the slides 45 and journalled at its ends in holes 73 in the slides for rocking movement relative to the carriage about a horizontal axis extending transversely of the apparatus. This rockshaft is located adjacent, parallel to and forward of the carriage cross-bar 47. Extending radially from the rockshaft in forward direction are arms each designated 75 each carrying an upwardly directed vacuum gripper 43, e.g. a rubber suction cup, at its free end. The cups are supplied with vacuum via a flexible vacuum line system 79 under control of a solenoid valve 81.

Figure 8:
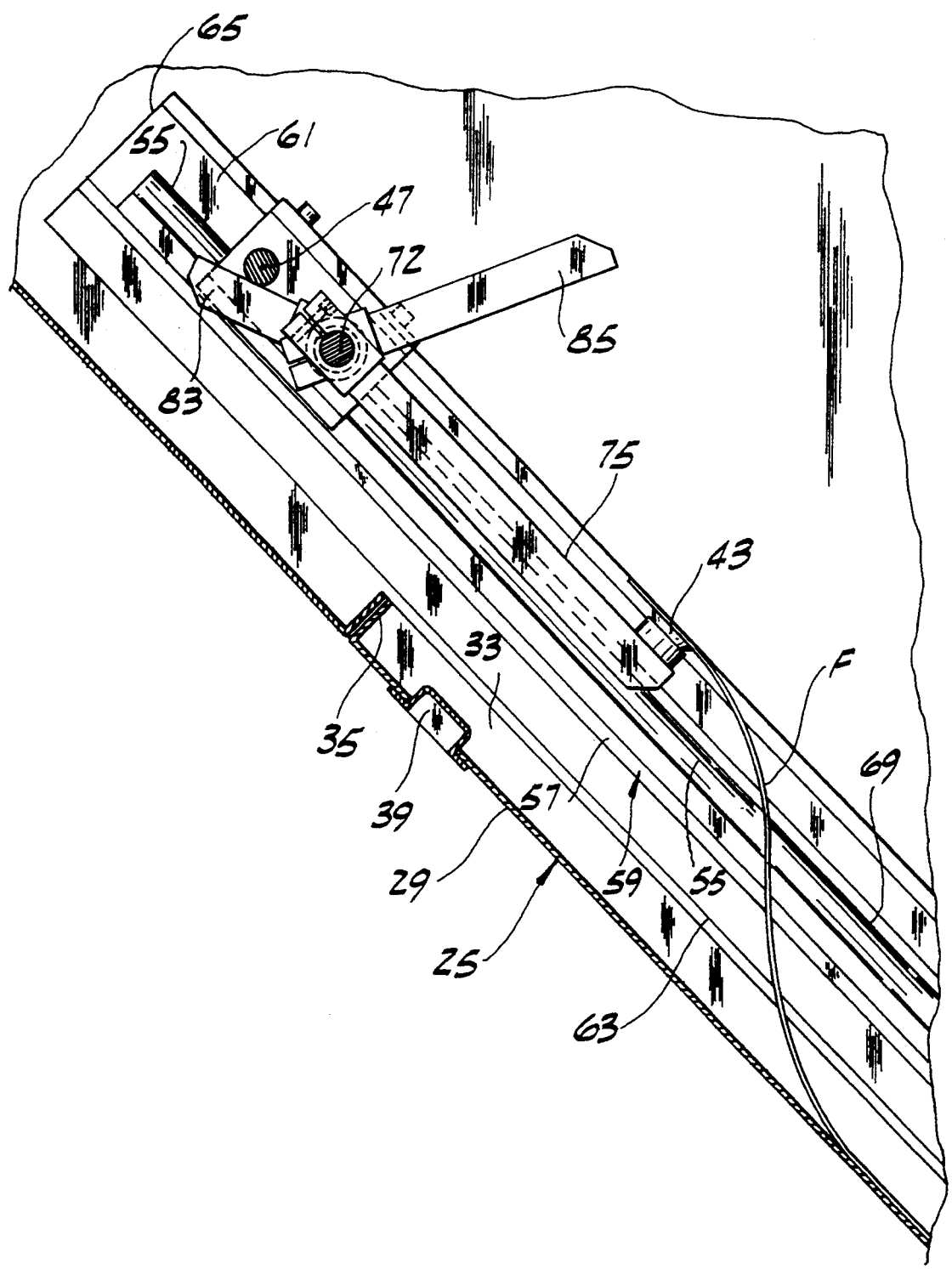
FIG. 8 is a view in section of the carriage at the upper and rearward end of its stroke.

The arms 75 carrying the vacuum grippers 43 are gravity-based to swing downward to the lowered position in which they are illustrated in solid lines in FIG. 8 extending forward from the carriage 41 generally coplanar with the carriage (i.e. in the inclined plane of the path of travel of the carriage), this lowered in-line position being determined by engagement of stop arms 83 on the rockshaft with the underside of the cross-bar. The arms are adapted to be swung up to a raised generally horizontal position (see FIGS. 1 and 9) for engagement of the vacuum grippers 43 with the bottom face of a film F on the raised window by engagement of a crank arm 85 extending radially from the rock shaft with a fixed abutment or stop 87 at the rearward end of the exposure station when the carriage 41 slides down the inclined rails 55 toward the exposure station. When the carriage slides back up on the rails (away from the exposure station), the arms 75 are released to swing down to their lowered in-line position, shown in FIG. 8.

The cable cylinders 29a and 33a for driving the platens 21 and 23 are connected in a pneumatic circuit indicated generally at 89 under control of solenoid valves 91 and 93 and operable to activate cylinder 29a and 33a to drive the platen 21 forward from its loading position to its exposure position and to drive the platen 23 rearward from its exposure position to its loading position and, alternately, to drive the platen 21 rearwardly from its exposure position back to its loading position and to drive the platen 23 forward from its loading position to its exposure position. The vacuum grooves 17L and 17R in the bottom face of the window 3 are connected in a vacuum circuit 95 under control of a solenoid valve 97. The cylinders 15 for driving the window 3 up and down are connected in the circuit under control of a solenoid valve 99 operable to move the window up and down. The cylinders 69 of the film discharge means 13 are connected in the pneumatic circuit under control of a solenoid valve 101 operable to move the carriage 41 down from its raised retracted position to its advanced lower position and to move it back up to its retracted position. The vacuum cups 43 are connected in the vacuum circuit 85 under control of the solenoid valve 81 operable to draw a vacuum in the cups or cut off the vacuum.

In the operation of the apparatus, after the last exposure through a film F on the bottom of the window 3, valve 97 is actuated to pull a vacuum in the grooves 17L, 17R in the bottom of the window to grip the film to the bottom of the window. Valve 99 is actuated to raise the window, thereby raising the film. The plate discharge means 11 is actuated, in known manner, to discharge the exposed plate P. With the tray 25 in its raised inclined film-receiving position (in which it is shown in solid lines in FIG. 1), and with the carriage 41 in its rearward raised retracted position at the upper rearward end of the inclined rails 55 (which is its home position), valve 101 is actuated to operate cylinders 69 to drive the carriage 41 down and forward on the rails. The carriage travels forward and down toward the exposure station and as it approaches the lower end of its stroke, the crank arm 85 engages the abutment 87, thereby rocking the rockshaft 71 in counterclockwise direction as viewed in FIG. 9 to swing the arms 75 up for engagement of the vacuum gripper cups 43 with the bottom face of the film F on the raised window 3. Valve 81 is actuated to draw vacuum in the cups for gripping of the film by the cups. Engagement of the cups with the film is adjacent the rearward edge of the film as it is retained on the bottom of the window. Valve 97 is then deactuated to cut off the vacuum in the vacuum grooves 17L, 17R, thereby to release the film from the bottom of the window. With the vacuum cups gripping the film, valve 101 is actuated to operate the rodless pneumatic cylinders 69 to drive the carriage 41 upward and rearward back to its retracted position at the upper end of the rails 55. With the film gripped to the carriage by the vacuum grippers 43, the film is pulled back out of the exposure station. The crank arm 85 moves back out of engagement with the abutment or stop 87, and the arms 75 swing back down to their lowered position (such as in phantom in FIG. 8) determined by engagement of arms 83 with the cross-bar 47 (see FIG. 8). The film is pulled back over the tray 25 and, as the carriage 41 reaches its rearward retracted home position (FIG. 8) valve 81 is deactuated to cut off the vacuum in the vacuum cups 43, and the film is thereby released for deposit in the tray 25.

It will be observed that with the tray 25 in its raised position, the operator's access to the platen 21 or 23 at the loading station 1 is unobstructed for placement of a plate or plates on that platen and placement of a film or films on the plate or plates. Discharged films stack up in order in the tray, and are readily retrievable by the operator standing at the loading station by swinging the tray down to the lowered position in which it is illustrated in FIG. 1.

In view of the above, it will be seen that the several objects of the invention are achieved and other advantageous results attained.

As various changes could be made in the above constructions without departing from the scope of the invention, it is intended that all matter contained in the above description and shown in the accompanying drawings shall be interpreted as illustrative and not in a limiting sense.

What is claimed is:

1. Apparatus for exposing photosensitized plates to light through films comprising an exposure station in which a plate is exposed to light through a film;

a window movable downwardly from a raised retracted position above a plate and film thereon in exposure position at the exposure station to a lowered position pressing down on the film and plate in exposure position;

a loading station adjacent the exposure station from which plates and films are fed forward into the exposure station, the window being raised for the infeed;

a platen movable from a position at the loading station for the manual loading thereon of a plate and a film on the plate or a plate per se to exposure position in the exposure station;

a light source for exposing the plate to light through the film when the window is down;

means associated with the window operable after exposure of a plate to light through film at the exposure station to grip the film to the bottom of the window for raising the film with the window when the window is raised;

plate discharge means operable when the window is raised for discharging the exposed plate from the exposure station; and film discharge means operable when the window is raised for discharging the raised film from the exposure station;

characterized in that:

the apparatus is provided with film-receiving means above the loading position of the platen at the loading station for receiving films discharged from the exposure station;

the film discharge means for discharging a raised film from the exposure station comprises means for transferring a film from its raised position on the bottom of the raised window to the film-receiving means;

the film-receiving means comprising a tray having an inclined film-receiving position in an inclined plane angled downwardly and forwardly toward the exposure station, the tray being pivoted at one end constituting its forward end toward the exposure station for swinging movement about a generally horizontal axis transverse to the apparatus between its inclined film-receiving position and a generally horizontal film-retrieving position above the loading station;

the film discharge means comprising a carriage extending transversely with respect to the apparatus above the loading station, means mounting the carriage for movement in an inclined plane above and generally parallel to the said inclined plane of the tray toward and away from the exposure station, a set of vacuum grippers carried by the carriage for movement up and down relative to the carriage between a raised position for gripping a film on the bottom of the raised window at the bottom face of the film and a lowered position for withdrawing the gripped film rearward from the exposure station and carrying it back over the tray, means for moving the carriage in its said inclined plane of movement between a rearward raised retracted position away from the exposure station and a forward lowered advanced position wherein the grippers are under the raised window, and means for raising and lowering the grippers.

2. Apparatus as set forth in claim 1 having means for holding the tray up in its inclined raised film-receiving position.

3. Apparatus as set forth in claim 1 wherein the means mounting the carriage for its movement toward and away from the exposure station in its said inclined plane of movement comprises a pair of inclined rails at opposite sides of the apparatus, said rails being angled forwardly and downwardly from their rearward and upper ends spaced rearward of the exposure station to their forward and lower ends adjacent the exposure station, the forward and lower ends of the rails being above the exposure position of a plate and film at the exposure station and below the level of the raised window, the carriage comprising a pair of slides slidable on the rails and a cross-connection between the slides, the carriage further having a rockshaft extending transversely of the apparatus between the slides and journalled at its ends in openings in the slides for rocking movement about an axis transverse to the apparatus, said rockshaft having a plurality of arms extending outwardly therefrom, each arm having a vacuum gripper thereon at its free end, said rockshaft and said arms being swingable on said rockshaft axis between a lowered position of said arms angled forward and downward from the carriage and generally in the inclined plane of movement of the carriage, said arms with the vacuum grippers thereon being biased to swing downward to their lowered position, said arms reaching forward under the raised window when the carriage moves forward and downward to the forward end of its stroke, and means for rocking the rockshaft to swing the arms to their said raised position for engagement of the vacuum grippers with the lower face of the film on the bottom of the window.

4. Apparatus as set forth in claim 3 wherein said means for rocking the rockshaft comprises a crank on the rockshaft and a fixed stop engagable by the crank as the carriage approaches the forward end of its stroke.

* * * * *

UNITED STATES PATENT AND TRADEMARK OFFICE
CERTIFICATE OF CORRECTION

PATENT NO. : 5,347,341

DATED : September 13, 1994

INVENTOR(S) : John W. Powers et al.

It is certified that error appears in the above-identified patent and that said Letters Patent is hereby corrected as shown below:

Column 10, claim 3, lines 40-41, "carriage, said" should read ---carriage and a raised position of said arms, said---.

Signed and Sealed this

Thirteenth Day of December, 1994

Attest:

BRUCE LEHMAN

Attesting Officer     Commissioner of Patents and Trademarks